(12) United States Patent
Li et al.

(10) Patent No.: US 10,429,971 B2
(45) Date of Patent: Oct. 1, 2019

(54) DISPLAY PANEL, MANUFACTURING METHOD THEREOF AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Hu Li, Beijing (CN); Jun Xu, Beijing (CN); Qing Zhang, Beijing (CN); Xiaofei Zhu, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 138 days.

(21) Appl. No.: 15/505,737

(22) PCT Filed: Feb. 18, 2016

(86) PCT No.: PCT/CN2016/073989
§ 371 (c)(1),
(2) Date: Feb. 22, 2017

(87) PCT Pub. No.: WO2017/045356
PCT Pub. Date: Mar. 23, 2017

(65) Prior Publication Data
US 2017/0285819 A1    Oct. 5, 2017

(30) Foreign Application Priority Data
Sep. 15, 2015  (CN) .......................... 2015 1 0587200

(51) Int. Cl.
*G06F 3/041*    (2006.01)
*G02F 1/1347*   (2006.01)
(Continued)

(52) U.S. Cl.
CPC .......... *G06F 3/0412* (2013.01); *G02F 1/1347* (2013.01); *G02F 1/133512* (2013.01);
(Continued)

(58) Field of Classification Search
CPC .... G02F 1/1347; G02F 1/1333; G06F 3/0412; G06F 3/041; G06F 2203/04103; H01L 51/5253; H01L 51/5281
See application file for complete search history.

(56) References Cited

U.S. PATENT DOCUMENTS 5,739,888 A * 4/1998 Ogura ................... G02F 1/1339
                                                            349/110
2008/0043179 A1* 2/2008 Matsuoka ......... G02F 1/133512
                                                            349/106
(Continued)

FOREIGN PATENT DOCUMENTS

CN    103210438 A    7/2013
CN    103221991 A    7/2013
(Continued)

OTHER PUBLICATIONS

May 27, 2016—(WO) International Search Report and Written Opinion Appn PCT/CN2016/073989 with English Tran.
(Continued)

*Primary Examiner* — Ariel A Balaoing
(74) *Attorney, Agent, or Firm* — Banner & Witcoff, Ltd.

(57) ABSTRACT

A display panel and a manufacturing method thereof, and a display device are disclosed. The display panel is divided into a display area and a non-display area, and the display panel includes: a display substrate; an upper substrate which is arranged on the display side of the display substrate and cell-assembled with the display substrate; and an adhesive layer which is arranged between the upper substrate and the display substrate, and the display panel further includes a
(Continued)

thin film layer which is arranged on the side of the upper substrate away from the display substrate, a region of which corresponding to the non-display area is an opaque area, and a region of which corresponding to the display area is a transparent area. Thus, the structure is simplified, the manufacturing method of the display panel is simplified without side curing, and the cost is also reduced.

20 Claims, 3 Drawing Sheets

(51) Int. Cl.
H01L 51/52 (2006.01)
G02F 1/1335 (2006.01)
G02F 1/1333 (2006.01)

(52) U.S. Cl.
CPC .......... *G06F 3/041* (2013.01); *H01L 51/5253* (2013.01); *H01L 51/5281* (2013.01); *G02F 2001/133388* (2013.01); *G06F 2203/04103* (2013.01); *G09G 2300/0439* (2013.01)

(56) References Cited

U.S. PATENT DOCUMENTS

| 2010/0103599 | A1* | 4/2010 | Kwak | H01L 51/5275 361/679.01 |
| 2011/0102346 | A1* | 5/2011 | Orsley | G06F 3/044 345/173 |
| 2011/0279757 | A1* | 11/2011 | Yamada | G02F 1/133528 349/96 |
| 2013/0242399 | A1 | 9/2013 | Tsuboi et al. | |
| 2015/0029428 | A1* | 1/2015 | Wang | G02B 5/201 349/42 |
| 2015/0070601 | A1* | 3/2015 | Lin | G02F 1/13338 349/12 |
| 2017/0052407 | A1 | 2/2017 | Moro et al. | |

FOREIGN PATENT DOCUMENTS

| CN | 103582908 A | 2/2014 |
| CN | 104216155 A | 12/2014 |
| CN | 105045436 A | 11/2015 |
| WO | 2010071350 A2 | 6/2010 |

OTHER PUBLICATIONS

Sep. 5, 2017—(CN) First Office Action Appn 201510587200.6 with English Tran.

* cited by examiner

DISPLAY PANEL, MANUFACTURING METHOD THEREOF AND DISPLAY DEVICE

The application is a U.S. National Phase Entry of International Application No. PCT/CN2016/073989 filed on Feb. 18, 2016, designating the United States of America and claiming priority to Chinese Patent Application No. 201510587200.6 filed on Sep. 15, 2015. The present application claims priority to and the benefit of the above-identified applications and the above-identified applications are incorporated by reference herein in their entirety.

TECHNICAL FIELD

The present disclosure pertains to a technical field of display, and specially relates to a display panel and a manufacturing method thereof and a display device.

BACKGROUND

With the development of science and technology, the quality and function of the display screen of the electronic products have been improved continually, and the application scope of the display screen has become wider and wider. Currently, the display screens of the electronic products mainly are mainly divided into two categories: liquid crystal display screens and OLED display screens. Taking the liquid crystal display screen for example, a touch panel or a transparent glass cover plate in the liquid crystal display screen can be affixed to the LCD module in two methods of a full lamination method and an edge lamination method. The edge lamination method refers to bonding the touch panel or the transparent glass cover plate along the peripheral area of the LCD module through adhesive (also known as frame adhesive); while the full lamination method refers to bonding the touch panel or the transparent glass cover plate with the entire LCD module through an optical clear adhesive (OCA) or an optical clear resin (OCR). Compared to the edge lamination method, the lamination structure with better optical properties of light transmittance, color saturation etc. can be obtained in the full lamination method. Therefore, the market share of the liquid crystal display bonding in the full lamination method continues to increase.

The full lamination method includes: coating an OCA or an OCR on the touch panel or the transparent glass cover plate, and pre-curing the OCA or OCR firstly; then bonding the touch panel or the transparent glass cover plate with the liquid crystal substrate, and irradiating for curing through UV rays.

FIG. 1 is a schematic diagram of surface curing and side curing which are carried on in a full lamination method for bonding in the display panel. As shown in FIG. 1, the liquid crystal touch screen is formed by bonding the touch control panel 4 with the liquid crystal substrate 5 through the adhesive layer 2, and the opaque black matrix 6 is arranged in the non-display area. The black matrix 6 plays roles of shading metal lines, defining the display area and decorating etc. However, as the black matrix 6 is opaque, it will influence the irradiating curing effect of UV rays on the OCA or the OCR, and leads to the phenomenon of lacking of adhesive or adhesive remaining at the edge of the touch control display screen, and then the appearance of the touch control display screen is influenced, the mura phenomenon occurs when the touch screen is in operation (for example, a finger touches the touch screen), thus the user experience is greatly affected.

In order to overcome the above problems, one current solution includes, as shown in FIG. 1, surface curing the OCA or the OCR by a surface curing light source 7 firstly and then side curing the OCA or the OCR by a side curing light source 8, so the curing rate of the OCA or the OCR is improved. However, this method not only increases the process operations, but also the side curing is difficult to operate and the curing effect is also unsatisfactory.

In addition, the liquid crystal substrate 5 is usually fixed within a frame (not shown) through an adhesive component such as an adhesive tape. When the height of the frame is higher than the thickness of the liquid crystal substrate 5, the light leakage of the liquid crystal substrate 5 can be avoided. However, the difficulty of side curing the OCA or the OCR is increased. If the height of the frame is decreased, the side curing will become easier, but the risk of the light leakage of the liquid crystal substrate 5 is increased.

Therefore, it is necessary to design a display panel, for which side curing is not necessary for the OCA or the OCR when the full lamination method is used for bonding in the display panel, and at the same time the irradiating curing effect is guaranteed, the difficulty of irradiating curing is reduced, the process operations is simplified and the risk of the light leakage of the liquid crystal substrate is reduced.

SUMMARY

With respect to the technical problem mentioned above, a display panel and a manufacturing method thereof and a display device are provided in the present disclosure. A structure of a thin film layer is adopted and a structure of a black matrix is saved in the display panel to simplify the structure of the display panel, the manufacturing method of the display panel is simplified without side curing, and the cost is also reduced.

The technical solution for solving the technical problem in the present disclosure includes a display panel, and the display panel is divided into a display area and a non-display area surrounding the display area at the periphery of the display area, and the display panel includes: a display substrate; an upper substrate which is arranged on the display side of the display substrate and cell-assembled with the display substrate; and an adhesive layer which is arranged between the upper substrate and the display substrate. The display panel further includes a thin film layer which is arranged on the side of the upper substrate away from the display substrate, a region of the thin film layer corresponding to the non-display area is an opaque area, and a region of the thin film layer corresponding to the display area is a transparent area.

Preferably, the adhesive layer is made of an optical clear adhesive (OCA) or an optical clear resin (OCR).

Preferably, the transparent area of the thin film layer is made of a transparent material, and the opaque area of the thin film layer is provided with an opaque material.

Preferably, the transparent material includes a polyethylene terephthalate (PET) material or a triacetate cellulose (TAC) material, and the opaque material includes a material that can be used for fabricating a black matrix.

Preferably, the thin film layer is adhered to the upper substrate through an OCA.

Preferably, the display substrate is a liquid crystal display substrate or an OLED display substrate, and the upper substrate is a touch screen or a transparent glass cover plate.

The technical solution for solving the technical problem in the present disclosure further includes a display device, which includes the above-mentioned display panel and a frame, and the frame is arranged on the outer side of the display panel, and a height of the frame is greater than a thickness of the display substrate of the display panel.

Preferably, the display device further includes a bonding component, and the display panel is encapsulated in the inner side of the frame by the bonding component.

The technical solution for solving the technical problem in the present disclosure further includes a manufacturing method of a display panel, wherein the display panel is divided into a display area and a non-display area surrounding the display area at the periphery of the display area, and the manufacturing method includes the following operations: bonding the display substrate with an upper substrate through an adhesive layer, wherein the adhesive layer is arranged in the display area and the non-display area; and attaching a thin film layer to a side of the upper substrate away from the display substrate, wherein a region of the thin film layer corresponding to the non-display area is an opaque area, and a region of the thin film layer corresponding to the display area is a transparent area.

Preferably, bonding the display substrate with an upper substrate through an adhesive layer includes: coating an OCA or an OCR on one side of the display substrate or the upper substrate; pre-curing the OCA or the OCR; laminating the upper substrate and the display substrate, so that the OCA or the OCR is between the upper substrate and the display substrate; and irradiating and curing the OCA or the OCR through UV rays to form the adhesive layer which bonds the upper substrate with the display substrate.

Preferably, irradiating and curing the OCA or the OCR with UV rays includes: irradiating the OCA or the OCR from one side of the upper substrate with UV rays to solidify the OCA or the OCR to form the adhesive layer.

Preferably, attaching a thin film layer to a side of the upper substrate away from the display substrate includes: coating the OCA or the OCR on the upper substrate or the thin film layer; and laminating the upper substrate and the thin film layer.

The technical effect of the present disclosure is as follows: the structure of a thin film layer is adopted and the structure of a black matrix is saved in the display panel, simplifying the structure of the display panel, the manufacturing method of the display panel is simplified without side curing, and the cost is also reduced.

DETAILED DESCRIPTION

In order to make those skilled in the art better understand the technical solution of the present disclosure, the display panel and the manufacturing method thereof and the display device of the present disclosure will be described in a detail way in connection with the drawings related to the embodiments of the disclosure in the following.

First Embodiment

The present embodiment provides a display panel, and the display panel is divided into a display area and a non-display area surrounding the display area at the periphery of the display area. The display panel includes: a display substrate; an upper substrate which is arranged on the display side of the display substrate and cell-assembled with the display substrate; and an adhesive layer which is arranged between the upper substrate and the display substrate. The display panel further includes a thin film layer which is arranged on the side of the upper substrate, which side is away from the display substrate, a region of the thin film layer corresponding to the non-display area is an opaque area, and a region of the thin film layer corresponding to the display area is a transparent area.

In the display panel provided in the present embodiment, the region of the thin film layer corresponding to the non-display area is designed as an opaque area to play the role of a black matrix. This method not only saves the process of forming the black matrix, saves the cost, but also allows the adhesive layer to be cured by irradiation before the thin film layer is provided, so that only a surface curing is required and no side curing is required to achieve a better irradiating curing effect.

Second Embodiment

Figure 1:
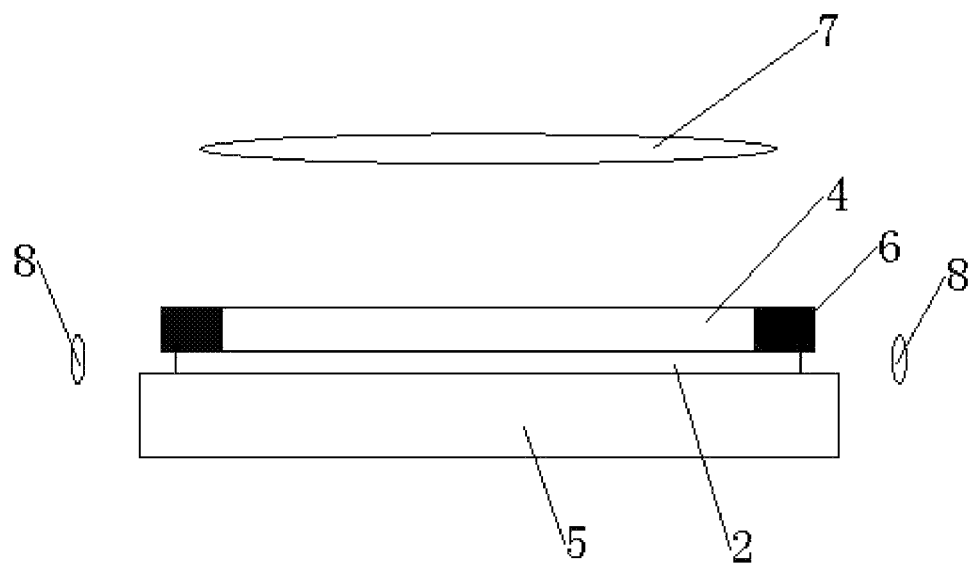
FIG. 1 is a schematic diagram of surface curing and side curing in a full lamination method of bonding a display panel in the state of art.
Figure 2:
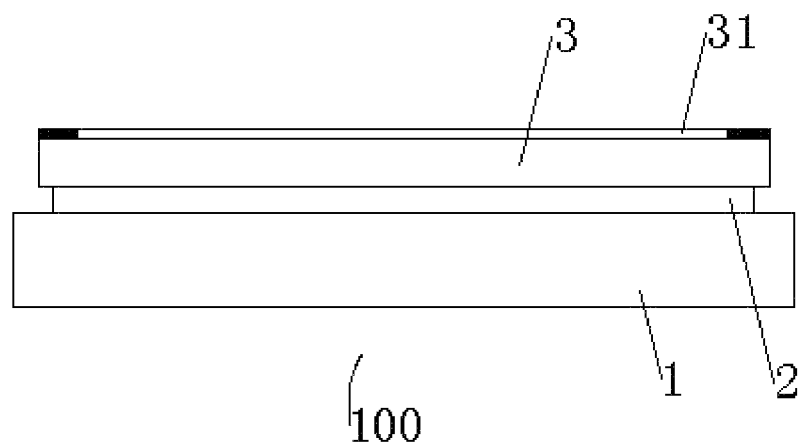
FIG. 2 is a schematic diagram of the structure of the display panel in a second embodiment of the present disclosure.

As shown in FIG. 2, a display panel 100 is provided in the present embodiment, and the display panel is divided into a display area and a non-display area surrounding the display area at the periphery of the display area. The display panel 100 includes: a display substrate 1; an upper substrate 3 which is arranged on the display side of the display substrate 1 and cell-assembled with the display substrate 1; and an adhesive layer 2 which is arranged between the upper substrate 3 and the display substrate 1. The display panel 100 further includes a thin film layer 31 which is arranged on the side of the upper substrate 3 away from the display substrate 1, a region of the thin film layer 31 corresponding to the non-display area is an opaque area, and a region of the thin film layer 31 corresponding to the display area is a transparent area.

Specifically, the thin film layer 31 is adhered to the side of the upper substrate 3 away from the display substrate 1 through a transparent adhesive material. Preferably, the transparent adhesive material is an optical clear adhesive (OCA).

The transparent area of the thin film layer 31 corresponds to the display area of the display panel 100, the transparent area of the thin film layer 31 is made of a transparent material, and a transparent film made of a polyethylene terephthalate (PET) material or a triacetate cellulose (TAC) material is preferably used to form the transparent area of the film layer 31; the opaque area of the thin film layer 31 is provided with an opaque material, and preferably, the material can be used for fabricating a black matrix, so that the opaque area of the thin film layer 31 can play the roles of shading metal lines, defining the display area and decorating etc. of the black matrix in the state of art. Thus, the embedded black matrix structure in the state of art is not used in the display panel 100, and only the opaque area is set in the thin film layer 31, so that the structure is simplified and the manufacturing process is simple.

Preferably, the adhesive layer 2 used for bonding the display substrate 1 with the upper substrate 3 is made of an OCA or an optical clear resin (OCR). Accordingly, after bonding the display substrate 1 with the upper substrate 3 and before attaching the thin film layer 31, the adhesive layer with a good bonding effect can be obtained by irradiating and curing the OCA or the OCR through UV rays.

The display panel in the present embodiment can achieve the same function as the display panel of the existing technology, thus it has a wide range of application. For example, the display panel 100 may be a liquid crystal panel with a display function only, accordingly, the display substrate 1 is a liquid crystal substrate, the upper substrate 3 is a transparent glass cover plate, the bonding structure is the same as or similar to that illustrated in FIG. 2; alternatively, the display panel 100 can be a liquid crystal touch panel with a display function and a touch control function, accordingly, the display substrate 1 is a liquid crystal substrate, the upper substrate 3 is a touch screen, and the bonding structure of the display panel 100 is the same as or similar to that shown in FIG. 2. For example, the display panel 100 can be an OLED panel with a display function only, accordingly, the display substrate 1 is an OLED substrate, the upper substrate 3 is a transparent glass cover plate, the bonding structure is the same as or similar to that illustrated in FIG. 2, alternatively, the display panel 100 can be an OLED touch panel with a display function and a touch control function, accordingly, the display substrate 1 is an OLED substrate, the upper substrate 3 is a touch screen, and the bonding structure is the same as or similar to that illustrated in FIG. 2.

It is easy to understand that, the display panel in the present embodiment can also be other kinds of panels not mentioned above. As long as the panels adopt a thin film layer with an opaque area similar to that of the present embodiment to replace the black matrix in the existing technology, the panels should be within the protection scope of the present disclosure.

Third Embodiment

The present embodiment provides a manufacturing method of a display panel for forming the display panel of the second embodiment.

Figure 3:
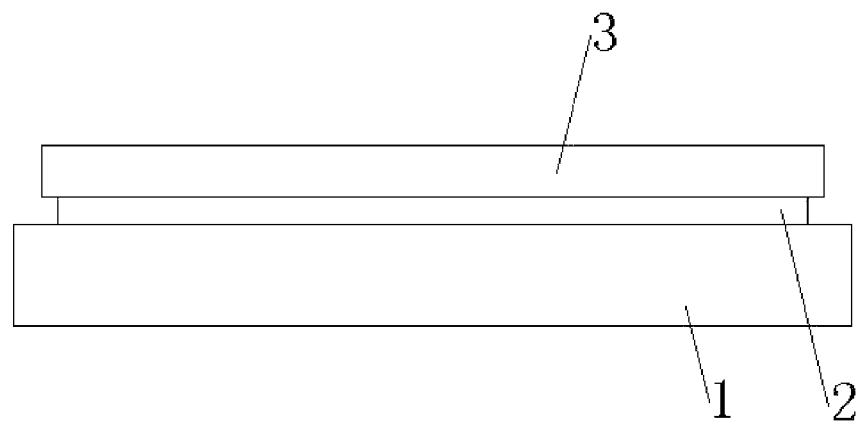
FIG. 3 is a schematic diagram for bonding a display substrate with an upper substrate in a third embodiment of the present disclosure.
Figure 4:
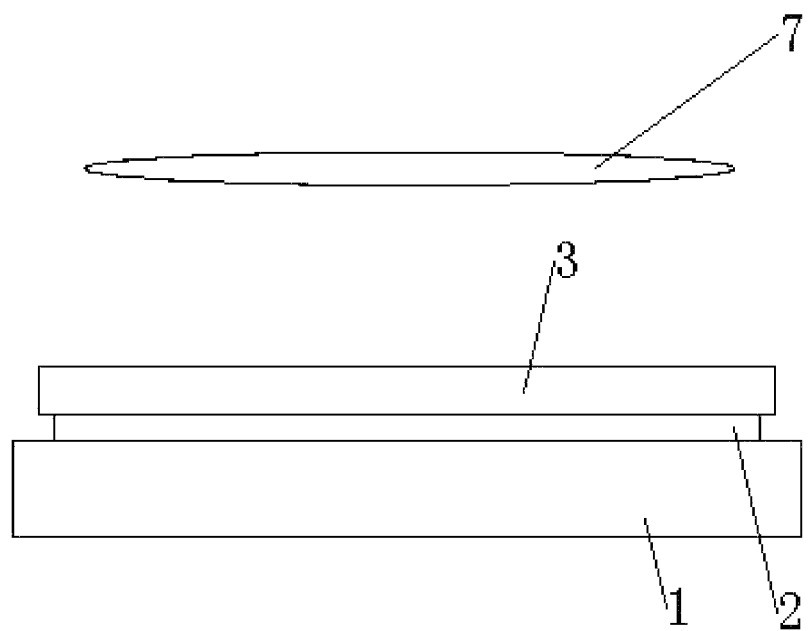
FIG. 4 is a schematic diagram of surface curing to form an adhesive layer in the third embodiment of the present disclosure.

Referring to FIG. 2, FIG. 3 and FIG. 4, the manufacturing method of the display panel includes the following operations of Step S1 and Step S2.

In Step S1, as shown in FIG. 3, the display substrate 1 is bonded with the upper substrate 3 through the adhesive layer 2, and the display panel to be formed is divided into a display area and a non-display area surrounding the display area at the periphery of the display area, and the adhesive layer 2 is arranged the areas between the display substrate 1 and the upper substrate 3 corresponding to the display area and the non-display area.

Specifically, Step S1 may include: cleaning the surfaces of the display substrate 1 and the upper substrate 3 to be applied with the OCA or the OCR, those surfaces are the surfaces of the display substrate 1 and the upper substrate to be connected with each other; applying the OCA or the OCR on the side of display substrate 1 to be bonded to the upper substrate 3 (or the side of the upper substrate 3 to be bonded to the display substrate 1); pre-curing the OCA or the OCR; laminating the upper substrate 3 and the display substrate 1, so that the OCA or the OCR is between the upper substrate and the display substrate; and adopting UV rays to irradiate the OCA or the OCR from one side of the upper substrate to solidify the OCA or the OCR, so as to form the adhesive layer 2, that is, as shown in FIG. 4, the adhesive layer 2 is formed in a surface curing method by adopting a surface curing light source 7, so that the upper substrate 3 is bonded with the display substrate 1.

In Step S2, a thin film layer 31 is attached to a side of the upper substrate 3 away from the display substrate 1; a region of the thin film layer 31 corresponding to the non-display area is an opaque area, and a region of the thin film layer corresponding to the display area is a transparent area, so that the display panel 100 shown in FIG. 2 of the second embodiment is formed.

Specifically, Step S2 may include: cleaning the side of the upper substrate 3 away from the display substrate 1; and coating the OCA or the OCR on the upper substrate 3 or the thin film layer 31. The OCA is preferable here, because the adhesion force required for bonding the upper substrate 3 with the thin film layer 31 is small, thus, it is only needed to coat the OCA directly and then bond the upper substrate 3 with the film layer 31 to meet the requirement of the operation. Of course, UV rays can also be used for irradiating and curing the OCA to improve the bonding force. Furthermore, the OCR can also be used, the UV rays can be used for irradiating and curing the OCR and bonding the upper substrate 3 with the thin film layer 31, the detailed manner is the same as the fabricating method of the adhesive layer 2, and detailed descriptions will be omitted here.

The manufacturing method of the display panel in the present embodiment saves the processes of printing, exposing and developing for manufacturing the embedded black matrix in the state of art, the manufacturing process is simplified and the manufacturing cost is saved. More importantly, because the display substrate and the upper substrate that are bonded together do not prevent the UV rays used for curing from being irradiated to the OCA or the OCR for forming the adhesive layer, so that only the surface curing is required for the OCA or the OCR without the side curing, a better effect of irradiating curing can be achieved, and the manufacturing process is further simplified.

It is easy to understand that, in the present embodiment, the display substrate 1 can be a liquid crystal display substrate or an OLED display substrate, and the upper substrate 3 can be a touch screen or a transparent glass cover plate. The corresponding manufacturing method is the same as the method mentioned above, and detailed descriptions will be omitted herein.

Fourth Embodiment

The present embodiment provides a display device, and the display device includes any one of the display panels mentioned above and a frame. The frame is arranged on the outer side of the display panel, and a height of the frame is greater than a thickness of the display substrate in the display panel. Because the OCA or the OCR used for forming the adhesive layer 2 does not need to be solidified in side curing in the present embodiment, the adhesive layer 2 can be arranged in the inner side of the frame, that is, the height of the frame can be designed to be greater than the thickness of the display substrate. Thus, the risk of light leakage of the display panel can be reduced.

The display panel included in the display device of the present embodiment can be an ordinary liquid crystal display panel, a liquid crystal touch panel or an OLED panel.

Figure 5:
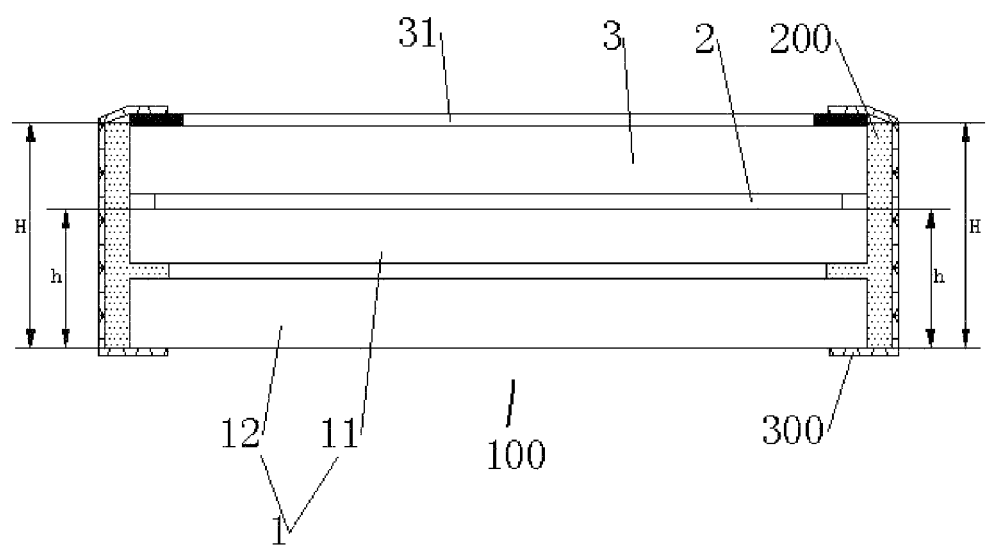
FIG. 5 is a structure schematic diagram of a display device in a fourth embodiment of the present disclosure.

Taking the liquid crystal touch panel as the display panel in the embodiment for example, as shown in FIG. 5, the display device includes a frame 200 and a display panel 100. The display panel 100 includes a display substrate 1, an adhesive layer 2, an upper substrate 3 and a thin film layer 31. The display substrate 1 includes a liquid crystal cell 11 and a backlight module 12, and the liquid crystal cell 11 and the backlight module 12 are encapsulated in the frame 200 through an adhesive component 300. Specifically, one side of the adhesive component 300 is adhered to the bottom surface of the display substrate 1, and then the other side of the adhesive component 300 is adhered to the upper surface of the film layer 31 through the outer side of the frame 200. For example, the adhesive component 300 may be an adhesive tape.

In an existing liquid crystal touch panel, the adhesive layer must be treated by side curing, thus the adhesive layer cannot be arranged at the inner side of the frame, that is, the height H of the frame can not be greater than the thickness h of the display substrate, otherwise the irradiating rays used in the method of side curing will be blocked by the frame and the adhesive layer can not be irradiated. In this case, the frame cannot be arranged higher than the thickness of the display substrate, and the display substrate may suffer from a risk of light leakage.

Compared with the existing technology, in the process of manufacturing the display panel 100 included in the display device of the present embodiment, the adhesive layer 2 is not required to be side-cured. Therefore, in the display device of the present embodiment, the height H of the frame 200 can be greater than the thickness h of the display substrate 1, so that the display substrate 1 is arranged in the frame 200 and the risk of light leakage of the display substrate 1 is reduced.

As the display device in the embodiment adopts the display panel mentioned above, not only the manufacturing process is simplified and the cost is saved, but also the height of the frame can further be designed larger in order to reduce the risk of light leakage of the display substrate.

It is easy to understand that, the display device can be further applied in other devices having a display function, for example: an electronic paper device, a mobile phone, a tablet computer, a television, a display, a notebook computer, a digital picture frame, a navigation system and so on.

It can be understood that, what are described above is related to the illustrative embodiments of the disclosure only and not limitative to the scope of the disclosure; the scopes of the disclosure are defined by the accompanying claims. Obviously, those skilled in the art may make various modifications and variations to the present disclosure but not departing from the spirit and scope of the disclosure. Thus, if these modifications and variations of the present disclosure belong to the scope of the claims of the disclosure and their equivalents technology, the present disclosure is also intend to include these modifications and variations.

What is claimed is:

1. A display panel, divided into a display area and a non-display area surrounding the display area at a periphery of the display area, wherein the display panel comprises:
   a display substrate, the display substrate having a display function;
   an upper substrate, which is arranged on a display side of the display substrate and cell-assembled with the display substrate;
   an adhesive layer, which is arranged between the upper substrate and the display substrate, wherein the adhesive layer is arranged in the display area and in the non-display area; and
   a thin film layer which is arranged on a side of the upper substrate away from the display substrate, wherein a region of the thin film layer corresponding to the non-display area is an opaque area, and a region of the thin film layer corresponding to the display area is a transparent area.

2. The display panel according to claim 1, wherein the adhesive layer is made of an optical clear adhesive (OCA) or an optical clear resin (OCR).

3. The display panel according to claim 1, wherein the transparent area of the thin film layer is made of a transparent material, and the opaque area of the thin film layer is provided with an opaque material.

4. The display panel according to claim 3, wherein the transparent material comprises a polyethylene terephthalate (PET) material or a triacetate cellulose (TAC) material, and the opaque material comprises a material that can be used for fabricating a black matrix.

5. The display panel according to claim 2, wherein the thin film layer is adhered to the upper substrate through the OCA.

6. The display panel according to claim 1, wherein the display substrate is a liquid crystal display substrate or an organic light-emitting diode (OLED) display substrate, and the upper substrate is a touch screen or a transparent glass cover plate.

7. A display device, comprising the display panel according to claim 1 and a frame, wherein the frame is arranged on an outer side of the display panel, and a height of the frame is greater than a thickness of the display substrate of the display panel.

8. The display device according to claim 7, further comprising a bonding component, wherein the display panel is encapsulated in an inner side of the frame through the bonding component.

9. A manufacturing method of a display panel, wherein the display panel is divided into a display area and a non-display area surrounding the display area at a periphery of the display area, the method comprising:
   bonding a display substrate with an upper substrate through an adhesive layer, wherein the adhesive layer is arranged in the display area and in the non-display area; and
   attaching a thin film layer to a side of the upper substrate away from the display substrate, wherein a region of the thin film layer corresponding to the non-display area is an opaque area, and a region of the thin film layer corresponding to the display area is a transparent area.

10. The manufacturing method of the display panel according to claim 9, wherein the bonding the display substrate with the upper substrate through the adhesive layer comprises:
    coating an optical clear adhesive (OCA) or an optical clear resin (OCR) on one side of the display substrate or the upper substrate;
    pre-curing the OCA or the OCR;
    laminating the upper substrate and the display substrate, so that the OCA or the OCR is between the upper substrate and the display substrate; and
    irradiating and curing the OCA or the OCR with UV rays to form the adhesive layer which bonds the upper substrate with the display substrate.

11. The manufacturing method of the display panel according to claim 10, wherein the irradiating and curing the OCA or the OCR with UV rays comprises:
    irradiating the OCA or the OCR from one side of the upper substrate with UV rays to solidify the OCA or the OCR to form the adhesive layer.

12. The manufacturing method of the display panel according to claim 9, wherein the attaching the thin film layer to the side of the upper substrate away from the display substrate comprises:
    coating an OCA or an OCR on the upper substrate or the thin film layer; and
    laminating the upper substrate and the display substrate.

13. The display panel according to claim 2, wherein the transparent area of the thin film layer is made of a transparent material, and the opaque area of the thin film layer is provided with an opaque material.

14. The display panel according to claim 13, wherein the transparent material comprises a polyethylene terephthalate (PET) material or a triacetate cellulose (TAC) material, and the opaque material comprises a material that can be used for fabricating a black matrix.

15. The display panel according to claim 2, wherein the display substrate is a liquid crystal display substrate or an organic light-emitting diode (OLED) display substrate, and the upper substrate is a touch screen or a transparent glass cover plate.

16. The display panel according to claim 3, wherein the display substrate is a liquid crystal display substrate or an organic light-emitting diode (OLED) display substrate, and the upper substrate is a touch screen or a transparent glass cover plate.

17. A display device, comprising the display panel according to claim 2 and a frame, wherein the frame is arranged on an outer side of the display panel, and a height of the frame is greater than a thickness of the display substrate of the display panel.

18. A display device, comprising the display panel according to claim 3 and a frame, wherein the frame is arranged on an outer side of the display panel, and a height of the frame is greater than a thickness of the display substrate of the display panel.

19. A display device, comprising the display panel according to claim 4 and a frame, wherein the frame is arranged on an outer side of the display panel, and a height of the frame is greater than a thickness of the display substrate of the display panel.

20. A display device, comprising the display panel according to claim 5 and a frame, wherein the frame is arranged on an outer side of the display panel, and a height of the frame is greater than a thickness of the display substrate of the display panel.

* * * * *